United States Patent [19]

Blankenship et al.

[11] Patent Number: 4,698,589
[45] Date of Patent: Oct. 6, 1987

[54] TEST CIRCUITRY FOR TESTING FUSE LINK PROGRAMMABLE MEMORY DEVICES

[75] Inventors: Timothy L. Blankenship, Palm Bay, Fla.; Joseph G. Nolan, III, San Jose, Calif.

[73] Assignee: Harris Corporation, Melbourne, Fla.

[21] Appl. No.: 842,267

[22] Filed: Mar. 21, 1986

[51] Int. Cl.4 .......................................... G01R 31/02
[52] U.S. Cl. ............................. 324/158 R; 324/73 R; 324/550; 371/21
[58] Field of Search .................. 324/158 R, 73 R, 133, 324/123 R, 525, 550; 371/22, 21, 25, 15; 307/465, 351

[56] References Cited

U.S. PATENT DOCUMENTS

| 3,712,537 | 1/1973 | Carita | 371/21 |
| 4,502,140 | 2/1985 | Proebsting | 371/21 X |
| 4,612,630 | 9/1986 | Rosier | 371/21 X |
| 4,625,311 | 11/1986 | Fitzpatrick et al. | 371/21 X |
| 4,626,713 | 12/1986 | Lee | 307/351 X |

Primary Examiner—Ernest F. Karlsen
Assistant Examiner—Vinh P. Nguyen
Attorney, Agent, or Firm—Barnes & Thornburg

[57] ABSTRACT

A testing circuit for testing fuse elements in programmable memory devices. The circuit provides for testing whether the fuses have the proper resistance, both after manufacturing and after programming of the memory device. The testing circuit includes a current varying means which may include either a variable resistance or a variable current sink. The variable resistance is connected to a fuse element to form a voltage divider with the same. A sensing amplifier is connected at a node therebetween for sensing the current through the fuse element and, thus, the resistance of the same. The variable current sink provides variable current levels, thereby achieving the same above results.

22 Claims, 2 Drawing Figures

4,698,589

TEST CIRCUITRY FOR TESTING FUSE LINK PROGRAMMABLE MEMORY DEVICES

BACKGROUND AND SUMMARY OF THE INVENTION

The present invention relates generally to testing circuitry, and more specifically to testing circuitry for measuring the resistance of programmable elements in fuse link memory devices.

Generally, programmable memory devices have multiple memory cells which are connected by fuses to the bit lines of the memory device. The memory devices are programmed to provide a preferred bit arrangement by blowing appropriate fuses. A typical fuse is made from either polycrystalline silicon or nichrome strips, and therefore, provides a minimal resistance between the memory cell and corresponding bit line when the fuse is intact. A blown or programmed fuse, however, increases the resistance significantly between the respective memory cell and bit line, thereby substantially reducing the current flowing through the memory cell to the respective bit line upon the memory cell being activated.

Typically, a memory cell having an intact fuse provides a high level logic signal to the respective bit line upon being activated, while a memory cell having a programmed or blown fuse provides a low level logic signal to the bit line. Defective intact fuses, however, may have resistances outside a specified range and thus adversely affect the access times and programmability of those memory cells associated with the defective fuses. Additionally, a fuse which is believed to have been blown during the programming phase of the memory device may have only been marginally blown, resulting in the improper programming of the corresponding memory cell.

It is, therefore, an object of this invention to provide an improved memory device having a testing circuitry for testing the proper functioning of the memory cells and their corresponding fuses.

It is further an object of this invention to provide a testing circuitry for determining whether the fuses of a programmable memory device have resistances within a specified range in their pre-programmed state.

It is another object of this invention to provide a testing circuitry for determining whether the fuses which have been programmed in a programmable memory device have been properly blown.

These and other objects are attained by providing a testing circuit connected to the programmable fuses and having a means for varying the current flow through the same. A sensing amplifier having its input connected to a nodal point between the fuses and the testing circuit and its output connected to the output stage of the memory device is provided for sensing the current flow through the fuses during both the normal reading and testing operations of the memory device. During the testing operation, the current flow through the memory cell under test is varied by a known amount in response to specific logic input signals applied to the testing circuit. The sensing amplifier then provides a first output logic signal when the current flowing through the respective cell and fuse is below a specific threshold, and a second output logic signal when the current flowing through the respective cell and fuse is above a specific threshold. By varying the current flow through the fuse by specified amounts, the determination of the fuse resistance may be made from the output of the sensing amplifier, thereby revealing whether an intact fuse has the proper low resistance after manufacturing and whether a blown fuse has the proper high resistance after programming.

The means for varying the current in a preferred embodiment includes a variable resistance means having a series of resistors connected across a series of N-channel devices. The variable resistance means forms a voltage divider with the fuse such that the sensing amplifier input is connected at a nodal point therebetween. The testing circuit provides a first resistance during a normal read operation of the memory device and a second resistance during a testing operation.

In another preferred embodiment, the means for varying current includes a variable current mirror formed of N-channel devices, whereby the output stage of the current mirror provides a current sink for the current flowing through the fuse. This preferred embodiment provides for a first current level during a normal read operation of the memory device and a second current level during a testing operation of the memory device.

The testing circuit may include a multiplexing switching means connected between the plurality of fuses and the sensing amplifier for multiplexing the programmable elements having these fuses with a single sensing amplifier. In the above preferred embodiments, the switching gate means includes an N-channel device having its source connected to the fuse of the programmable element and its drain connected to the input of the sensing amplifier. The gate of the switching gate means would thereby be triggered by multiplexing signals.

Although the preferred embodiments show the use of N-channel devices with an NPN matrix cell, the testing circuitry may also be used with other types of matrix cells. Additionally, either the variable resistance means or the means for varying current means may be implemented with P-channel devices or bipolar devices.

Other objects, advantages and novel features of the present invention will become apparent from the following detailed description of the invention when considered in conjunction with the accompanying drawings.

DETAILED DESCRIPTION OF THE DRAWINGS

Figure 1:
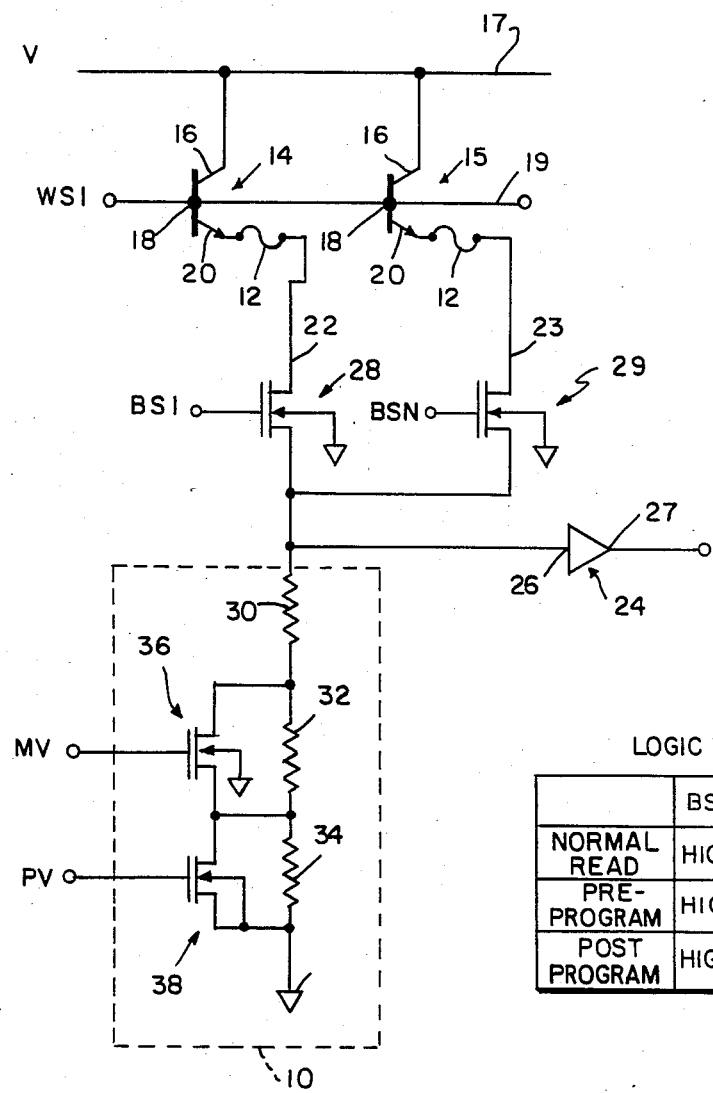
FIG. 1 represents a schematic diagram of the testing circuitry incorporating the principles of the present invention.

Referring to FIG. 1, a preferred embodiment shows a testing circuit 10 for determining the proper function of the fuse element 12 in a memory device. The memory device consists of a plurality of memory cells formed of NPN bipolar transistors of which 14 and 15 are shown in FIG. 1. Each of these transistors 14 and 15 have their collectors 16 connected to a supply line 17, their bases 18 connected to a word line 19, and their emitters 20 connected to a plurality of bit lines of which 22 and 23 are shown. With respect to the memory cells 14 and 15 shown in FIG. 1, the fuse elements 12 are arranged between the emitter 20 and the respective bit lines 22 and 23. The fuse elements 12 when intact have a minimal resistance, thereby providing close to a direct current path from the memory cell 14 to the respective bit line 22 and 23. The memory device further includes a sensing amplifier 24 having an input stage 26 connected to the respective bit lines 22 and 23 and an output stage 27 connected to an output buffer stage (not shown) of the memory device. The amplifier 24 provides a first logic signal at its output 27 in response to sensing a level of voltage above a specific threshold at its input 26. In an absence of current or of current flow through the fuse which is less than a specified threshold, the corresponding voltage reflecting the current will cause a second logic signal to be provided at the output 27 of the amplifier 24.

A plurality of transmission gates such as 28 and 29 may be provided between the output leads of the fuse elements 12 and the input of the sensing amplifier 26 for multiplexing a plurality of bit lines and corresponding memory cells with the sensing amplifier 24. These transmission gates are each formed of an N-channel insulated gate field effect device with their sources connected to the fuses 12, their drains connected to the sensing amplifier 24 and their gates connected to a source of multiplexing signals.

The testing circuit 10 of this preferred embodiment includes a series of three resistors 30, 32, 34 of specified resistances which are chosen depending upon the type of memory circuit involved. These resistors are serially connected to the bit lines 22 and 23 between the input 26 of the sensor amplifier 24 and ground potential 31. The resistance values for resistors 30, 32, 34 in the preferred embodiment are approximately 4.2K, 1.05K, and 5.6K, respectively. The resistance bridge forms a variable voltage divider with the respective fuse elements 12, with the input 26 of the sensing amplifier 24 connected between these elements and the resistors. Across the lower two resistors 32 and 34 are series connected N-channel IGFET devices 36 and 38. Resistor 32 is connected in parallel with the drain and source of the N-channel device 36, while resistor 34 is connected in parallel to the source and drain of N-channel device 38. The gates of the two N-channel devices 36 and 38 are connected to independent sources of logic signals MV and PV which sources are not shown.

In the normal read operation of the memory device, logic signals WS1 are applied to the word line 19 which triggers the respective memory cells to conduct current. The memory cells then apply the proper logic signals to the respective bit lines according to the preprogramming of the fuses. With respect to the memory cells and testing circuit of FIG. 1, a low level logic signal $\overline{MV}$ is applied to the gate of the N-channel device 36 and a high level logic signal PV is applied to the gate of the N-channel device 34 during this operation. This results in biasing the N-channel device 36 in its off state and the other N-channel device 34 in its on state. This allows the lower leg of the voltage divider to comprise of resistors 30 and 32, thereby providing the necessary resistance which allows for the sensing amplifier 24 to trigger accordingly.

During the first of two testing operations of the memory device, the fuses are tested for low resistance to determine if they are properly intact after manufacturing. High level logic signals, MV and PV, are applied to both N-channel devices 36 and 38, thereby turning both gates on, and thus, providing a current path to ground potential 31 which bypasses resistors 32 and 34. This allows for the resistor 30 which has a low resistance of about 4.2K ohms to form the lower leg of the voltage divider, thereby providing the sensitivity required to determine if the fuse 12 under test has the low resistance associated with intact fuses. Ordinarily, if a fuse had too high a resistance, the input voltage to the sensing amplifier 24 will be such that the sensing amplifier 24 will not trigger, treating the intact fuse 12 as if it were not present. By providing a minimal resistance on the lower leg of the divider, the amplifier 24 will be sure not trigger if the intact fuse 12 being tested is out of specification. This will avoid a border line fuse from allowing the amplifier to trigger and thus indicating to an observer of the existence of the faulty fuse. The following equation provides the representation of the voltage divider in this mode of operation:

$$V_1 = \frac{R_{30}}{R_{30} + R_{12}} \times V$$

where $V_1$ is approximately the voltage at the input of the sensing amplifier and V is the voltage of the supply potential.

During the second of the two testing operations, the fuses 12 are tested after programming of the device for determining if the programmed fuses have been adequately blown. A high resistance is formed in the lower leg of the voltage divider by providing low level logic signals, MV and PV, to both gates of the N-channel devices 36 and 38, thereby turning both devices off. This allows all three resistors 30, 32, 34 to form the lower leg and, thus, provide a significantly high resistance of approximately 10.85K ohms to determine if the fuse 12 was marginally or completely blown. If a fuse had not been blown completely during programming, it possibly would not have a high enough resistance to decrease the current flowing through it sufficiently and thus it could allow the sensing amplifier 24 to trigger, thereby giving faulty programming results. By using a high resistance on the lower portion of the divider for the second part of the test, the amplifier will be able to trigger if the fuse is marginal, thereby indicating an improperly programmed fuse to the programmer. The following equation provides a representation of the divider in this mode of operation:

$$V_1 = \frac{R_{30} + R_{32} + R_{34}}{R_{30} + R_{32} + R_{34} + R_{12}} \times V$$

Figure 2:
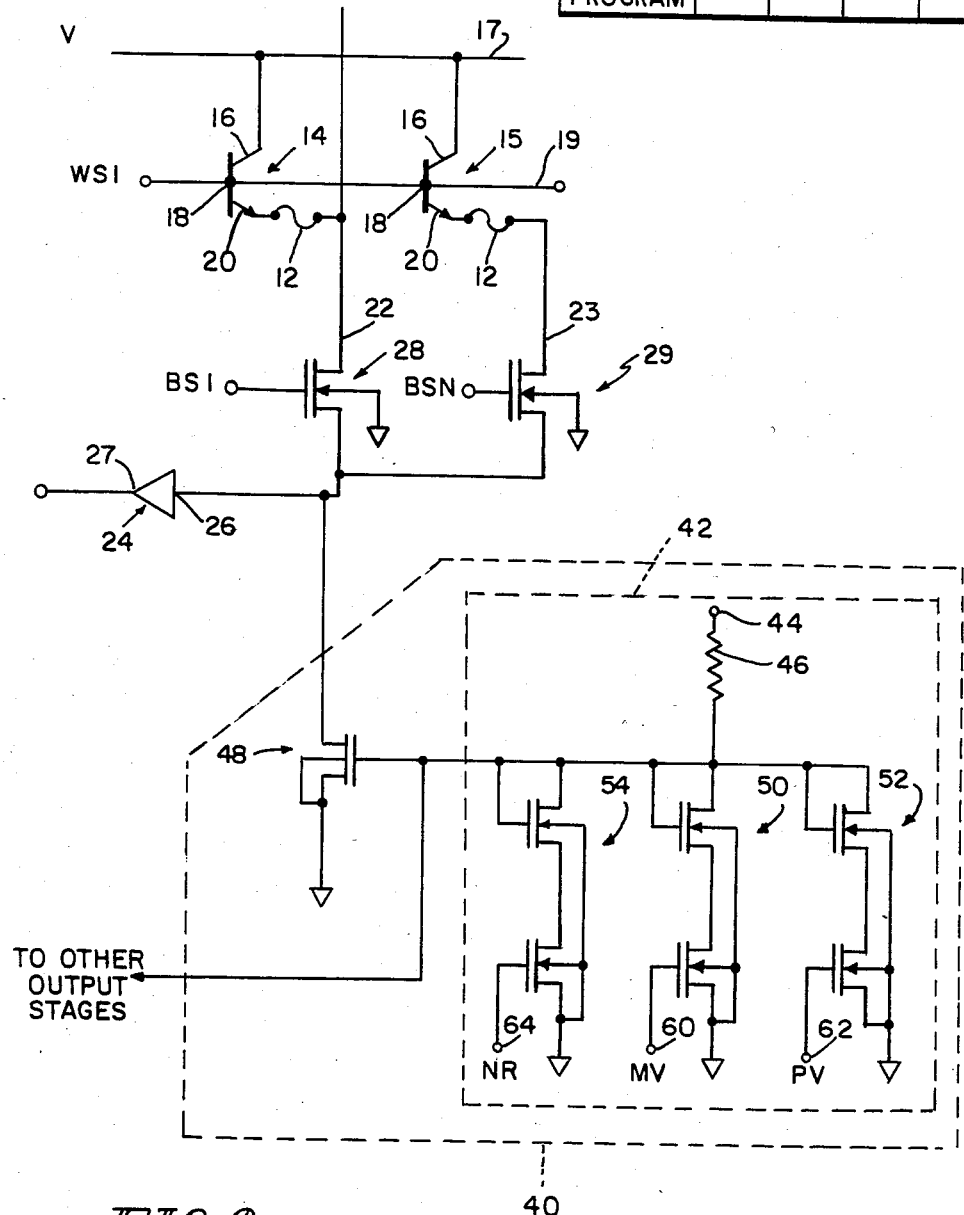
FIG. 2 represents a schematic diagram of another embodiment of the testing circuit.

In FIG. 2, the variable resistance circuit 10 is replaced by a variable current mirror 40. The input stage 42 of the current mirror 40 includes three pairs of N-channel IGFET devices coupled between a power source 44 and ground potential 31, with each pair having their drains coupled to each other. The sources and gates of the upper N-channel devices of each pair are connected to each other and to both the power source 44 via resistance 46 and to a plurality of input stage devices 48 of the current mirror 40. The sources to each of the lower N-channel devices of the three pairs are connected to each other and to ground potential 31. The gates of these lower devices are connected to independent sources of logic signals NR, MV, PV of which sources are not shown.

FIG. 2 shows and output stage 48 of the current mirror 40 which includes a single N-channel IGFET device having its source connected to the input stage 26 of the sensing amplifier 24, its drain connected to ground potential 31, and its gate connected to the sources and gates of the upper devices 50, 52, 54 of the input stage 42. The gate of the output stage 48 may also be connected to gates of other output stages for providing of testing of additional memory cells with fuses connected to these other output stages.

As with the previous embodiment, transmission gates 28 and 29 may be included for multiplexing bit lines 22 and 23 with the sensing amplifier 24. Similar to FIG. 1, the transmission gates 28 and 29 are formed of N-channel insulated gate field effect devices arranged between the respective fuses 12 and the inputs to the sensing amplifier 24. Specifically, their sources are connected to the respective fuses 12, their drains to both the input stage 26 of the sensing amplifier 24 and the source of the respective N-channel devices 48, and their gates to a multiplexing circuit, which circuit is not shown.

Similar to the preferred embodiment of FIG. 1, specific combinations of logic signals are provided to the testing circuit 40 for activating the respective N-channel devices 50, 52, 54. This provides for specified current levels for the current flowing through the respective fuse element 12. In the normal read operation of the memory device, high level logic signals MV and PV are applied to the gates of the respective N-channel devices 50 and 52 and a low level logic signal NR is applied to the respective gate of 54, thereby providing a current path from power source 44 through resistor 46 and the pairs of N-channel devices 50 and 52. This results in a reflective current in the output stage 48 of the current mirror 40 corresponding to the ratio of the area (channel length and device width) of the input stage to output stage of the current mirror. An appropriate level of current thereby flows through the respective memory cell 14 and fuse 12 which will trigger the sensing amplifier accordingly.

During the first testing operation of the memory cell 14, the low resistance of the respective intact fuses are tested by applying the high level logic signals (MV, PV, NR) to the respective gates of all three lower N-channel devices of the three pairs 50, 52, 54; thereby providing a current path through all three device pairs, with a reflected current being drawn through the N-channel device of the output stage 48 corresponding to the new ratio of areas of the input to output stages. This allows for the determination of whether the intact fuse under test has too high of a resistance by determining whether the input voltage to the sensing amplifier 24 will drop low enough such that the amplifier 24 will not trigger appropriately.

For testing whether programmed fuses are marginally blown and thus improperly programmed, low level logic signals (MV and NR) are provided at the respective gates of N-channel device pairs 50 and 54 while a high level logic signal PV is provided at the respective gate of N-channel device pair 52. If a program fuse is marginally blown, the input voltage to the input stage 26 of the sensing amplifier 24 could be sufficiently large such that the amplifier 24 may trigger inappropriately. By providing a single current path through N-channel 50 of the current mirror, the fuse 12 under test will trigger the amplifier if the fuse is marginal, thereby indicating to the programmer of the faulty fuse.

From the preceding description of the preferred embodiments, it is evident that the objects of the invention are attained, and although the invention has been described and illustrated in detail, it is to be clearly understood that the same is by way of illustration and example only and is not to be taken by way of limitation. Although the above description discusses using the testing circuitry with fuse elements, the same circuitry may be applied to any programmable devices having both a high or low resistivity states.

What is claimed is:

1. A testing circuit for determining the proper functioning of a programmable element in a memory device having a sensing means connected to said programmable element for providing a first signal when a current flowing through said programmable element is below a specified threshold and a second signal when said current flow is above said specified threshold, said testing circuit comprising:

a variable resistance means forming a voltage divider with said programmable element, said sensing means being connected at a nodal point therebetween, said variable resistance means providing a first resistance during a normal read operation of said memory device and a second resistance during a testing operation of said memory device for varying said current flow, whereby current flowing through said programmable element is sensed during said operations by said sensing means.

2. The testing circuit of claim 1, wherein said variable resistance means includes a plurality of resistor means connected in series and a plurality of switching means connected in parallel with said resistance means for providing said first resistance when said switching means receives a first combination of logic signals and said second resistance when said switching means receives a second combination of logic signals.

3. The testing circuit of claim 2, wherein each of said switching means includes an N-channel insulated gate field effect transistor having its drain and source connected in parallel with one of said resistor means and its gate connected to a source of said logic signals.

4. The testing circuit of claim 2, wherein said second resistance is less than said first resistance for testing whether said programmable element is properly intact.

5. The testing circuit of claim 2, wherein said second resistance is greater than said first resistance for testing whether said programmable element has been properly programmed.

6. The testing circuit of claim 3, further comprising a plurality of multiplexing switching means and a plurality of programmable elements, wherein each of said multiplexing switching means is connected between each of said programmable elements and said sensing means for multiplexing said plurality of programmable elements with said sensing means.

7. The testing circuit of claim 6, wherein each of said multiplexing switching means includes an N-channel insulated gate field effect device having its source connected to one of said programmable elements, its drain connected to said input means of said sensing means and to said variable resistance means, and its gate connected to a source of multiplexing signals.

8. A testing circuit for measuring the resistance of a programmable element in a memory device, comprising:

a variable resistance means connected to said programmable element for providing a first resistance during a read operation of said programmable element and at least one other resistance during a testing operation of the same, thereby varying a current flow through said programmable element respectively; and a sensing means connected at a nodal point between said programmable element and said variable resistance means for sensing said current flow, thereby sensing said resistance of said programmable element.

9. The testing circuit of claim 8, wherein said variable resistance means includes a plurality of resistor means connected in series and a plurality of switching means connected in parallel to said resistance means, each of said switching means includes an input means for receiving a logic signal and an output means connected to one of said resistor means for controlling said current path through said resistor means, said variable resistance means providing said first resistance when said input means of said switching means receives a first combination of logic signals and said second resistance when said input means receives a second combination of logic signals.

10. The testing circuit of claim 9, wherein each of said switching means includes an N-channel insulated gate field effect transistor having its drain and source connected in parallel with one of said resistor means and its gate connected to a source of said logic signals.

11. The testing circuit of claim 10, wherein said variable resistance means provides a third resistance when said input means of said switching means receives a third combination of logic signals.

12. The testing circuit of claim 11, wherein said second resistance is less than said first resistance for testing whether said programming element is properly intact and said third resistance is greater than said first resistance for testing whether said programming element has been properly programmed.

13. The testing circuit of claim 8, wherein said sensing circuit includes a sensing amplifier having an input means and an output means for providing a first output signal when a current flowing through said programmable element is below a specified threshold and a second output signal when said current is above said specified threshold.

14. A sensing circuit for sensing a current flowing through a programmable element in a memory device, said sensing circuit comprising:

a sensing means having an input means connected to said programmable element for providing a first signal when said current flowing through said programmable element is below a specified threshold and a second signal when said current flowing through said programmable element is above a certain threshold; and a varying current level means connected to an output of said programmable element and said input means of said sensing means for providing a first current level during a normal read operation of said memory device and a second current level during a testing operation of said memory device.

15. The sensing circuit of claim 14, wherein said varying current level means includes a current mirror having an output stage connected to said programmable elements and an input stage for varying the current flow in said output stage in response to a plurality of logic input signals provided at the input stage.

16. The sensing circuit of claim 15, wherein said input stage includes a plurality of control legs connected in parallel and to a plurality of sources of logic input signals for providing different current levels.

17. The sensing circuit of claim 16, wherein said output stage of said varying current level means includes a single N-channel insulated gate field effect transistor connected to said programmable element and wherein said parallel connected control legs include a plurality of N-channel insulated gate field effect transistors having respective input stages for receiving said logic input signals, whereby said logic input signals determined the number of N-channel transistors which are active in the input stage of said current mirror during said normal and testing operations.

18. The sensing circuit of claim 17, wherein said plurality of N-channel devices include three pairs of devices connected in parallel, each pair having an upper and lower N-channel device connected to each other by their drains and having the sources and gates of said upper devices connected to both a power source and said gate of said single N-channel device, the sources of said lower devices connected to a ground potential, and the gates of said lower devices connected to sources of said logic signals.

19. The sensing circuit of claim 18, further comprising a plurality of multiplexing switching means and a plurality of programmable elements, wherein each of said multiplexing switching means is connected between each of said programmable elements and both said sensing means and varying current level means for multiplexing said plurality of programmable elements with said sensing means and varying current level means.

20. The sensing circuit of claim 19, wherein each of said multiplexing switching means includes an N-channel insulated gate field effect device having its source connected to one of said programmable elements, its drain connected to both said input means of said sensing means and to varying current level means, and its gate connected to a source of multiplexing signals.

21. The sensing circuit of claim 14, wherein said means for varying current level includes a variable resistance means forming a voltage divider with said programmable element, said sensing means being connected at a nodal point therebetween, said resistance means providing a first resistance during a normal read operation of said memory device and a second resistance during a testing operation of said memory device for varying said current flow, whereby current flowing through said programmable element is sensed during said operations by said sensing means.

22. The sensing circuit of claim 21, wherein said variable resistance means includes a plurality of resistor means connected in series and a plurality of switching means connected in parallel with said resistance means for providing said first resistance when said switching means receives a first combination of logic signals and said second resistance when said switching means receives a second combination of logic signals.

* * * * *